(12) United States Patent
Eschbach et al.

(10) Patent No.: US 10,540,453 B2
(45) Date of Patent: *Jan. 21, 2020

(54) CREATION OF VARIABLE CUT FILES FOR PACKAGE DESIGN

(71) Applicant: Xerox Corporation, Norwalk, CT (US)

(72) Inventors: Reiner Eschbach, Webster, NY (US); Stephen C. Morgana, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 59 days.

This patent is subject to a terminal disclaimer.

(21) Appl. No.: 15/831,807

(22) Filed: Dec. 5, 2017

(65) Prior Publication Data

US 2018/0101623 A1   Apr. 12, 2018

Related U.S. Application Data

(63) Continuation of application No. 14/280,847, filed on May 19, 2014, now Pat. No. 9,892,212.

(51) Int. Cl.
*G06F 17/50* (2006.01)
*B31B 50/20* (2017.01)
(Continued)

(52) U.S. Cl.
CPC ............ *G06F 17/50* (2013.01); *B31B 50/006* (2017.08); *B31B 50/20* (2017.08); *B31B 2100/00* (2017.08);
(Continued)

(58) Field of Classification Search
None
See application file for complete search history.

(56) References Cited

U.S. PATENT DOCUMENTS

| 3,902,655 A | 9/1975 | Huffman |
| 5,235,519 A | 8/1993 | Miura |

(Continued)

FOREIGN PATENT DOCUMENTS

| EP | 621113 A1 | 10/1994 |
| WO | 2005000681 A2 | 1/2005 |

(Continued)

OTHER PUBLICATIONS

Lu et al., "Folding Cartons with Fixtures: A Motion Planning Approach", IEEE Transactions on Robotics and Automation, vol. 16, No. 4, Aug. 2000, pp. 346-356.

(Continued)

*Primary Examiner* — Carlos R Ortiz Rodriguez
(74) *Attorney, Agent, or Firm* — Fox Rothschild LLP

(57) ABSTRACT

A package design system uses a package design file to cause a cutting device to create a package. The file includes comprises a two-dimensional representation of a three-dimensional structure having a plurality of facets having alternative design scenarios that can be selected based on conditions of the cutting and/or folding device that is used to create the package. An example of such a condition is a thickness of a substrate that is being processed by the device. The system creates the file by creating a set of cut and/or fold line definitions. At least one of the cut and/or fold line definitions will be a variable cut/fold line definition. For each identified variable cut/fold line definition, the system identifies one or more alternate parameters for the variable cut/fold line definition, a first cutting/folding scenario that will not use the alternate parameters, and a second cutting/folding scenario that will use the alternate parameters.

20 Claims, 9 Drawing Sheets

(51) Int. Cl.
*B31B 100/00* (2017.01)
*B31B 50/00* (2017.01)
*B31B 110/35* (2017.01)

(52) U.S. Cl.
CPC ... *B31B 2100/0022* (2017.08); *B31B 2110/35* (2017.08)

(56) References Cited

U.S. PATENT DOCUMENTS

| | | | |
|---|---|---|---|
| 5,291,583 A | 3/1994 | Bapat |
| 5,353,390 A | 10/1994 | Harrington |
| 5,457,904 A | 10/1995 | Colvin |
| 5,513,117 A | 4/1996 | Small |
| 5,518,574 A | 5/1996 | Yates et al. |
| 5,528,517 A | 6/1996 | Loken |
| 5,687,087 A | 11/1997 | Taggart |
| 5,768,142 A | 6/1998 | Jacobs |
| 5,805,784 A | 9/1998 | Crawford |
| 5,838,574 A | 11/1998 | Olson et al. |
| 5,881,538 A | 3/1999 | Blohm |
| 5,923,556 A | 7/1999 | Harris |
| 6,005,959 A | 12/1999 | Mohan et al. |
| 6,090,027 A | 7/2000 | Brinkman |
| 6,092,054 A | 7/2000 | Tackbary et al. |
| 6,117,061 A | 9/2000 | Popat et al. |
| 6,134,018 A | 10/2000 | Dziesietnik et al. |
| 6,153,039 A | 11/2000 | Jacobsen |
| 6,237,787 B1 | 5/2001 | Gallo et al. |
| 6,243,172 B1 | 6/2001 | Gauthier et al. |
| 6,246,468 B1 | 6/2001 | Dimsdale |
| 6,332,149 B1 | 12/2001 | Warmus et al. |
| 6,409,019 B1 | 6/2002 | Hornsby et al. |
| 6,687,016 B2 | 2/2004 | Gauthier |
| 6,689,035 B1 | 2/2004 | Gerber |
| 6,771,387 B2 | 8/2004 | Gauthier |
| 6,895,549 B1 | 5/2005 | Albright et al. |
| 6,896,250 B2 | 5/2005 | Hillebrand |
| 6,939,063 B2 | 9/2005 | Bussell |
| 6,945,645 B2 | 9/2005 | Baron |
| 6,948,115 B2 | 9/2005 | Aizikowitz et al. |
| 6,953,513 B1 | 10/2005 | Volkert |
| 7,013,616 B1 | 3/2006 | Powers et al. |
| 7,174,720 B2 | 2/2007 | Kennedy |
| 7,191,392 B1 | 3/2007 | Coar |
| 7,197,465 B1 | 3/2007 | Hu et al. |
| 7,243,303 B2 | 7/2007 | Purvis et al. |
| 7,293,652 B2 | 11/2007 | Learn et al. |
| 7,327,362 B2 | 2/2008 | Grau |
| 7,366,643 B2 | 4/2008 | Verdura et al. |
| 7,367,027 B1 | 4/2008 | Chen et al. |
| 7,406,194 B2 | 7/2008 | Aizikowitz et al. |
| 7,413,175 B2 | 8/2008 | Levine et al. |
| 7,446,404 B2 | 11/2008 | Huang et al. |
| 7,647,752 B2 | 1/2010 | Magnell |
| 7,832,560 B2 | 11/2010 | Tilton |
| 7,941,465 B2 | 5/2011 | Gombert et al. |
| 8,160,992 B2 | 4/2012 | Gombert et al. |
| 8,170,706 B2 | 5/2012 | Gombert et al. |
| 8,170,709 B2 | 5/2012 | Puissant |
| 8,195,227 B1 | 6/2012 | Bushman et al. |
| 2002/0085001 A1 | 7/2002 | Taylor |
| 2002/0091592 A1 | 7/2002 | Sugiura et al. |
| 2002/0104293 A1 | 8/2002 | Armington et al. |
| 2002/0118874 A1 | 8/2002 | Chung et al. |
| 2003/0035138 A1 | 2/2003 | Schilling |
| 2003/0083763 A1 | 5/2003 | Kiyohara et al. |
| 2003/0091227 A1 | 5/2003 | Chang et al. |
| 2003/0164875 A1 | 9/2003 | Myers |
| 2003/0200111 A1 | 10/2003 | Damji |
| 2004/0073407 A1 | 4/2004 | Nguyen et al. |
| 2004/0120603 A1 | 6/2004 | Gupta |
| 2004/0218799 A1 | 11/2004 | Mastie et al. |
| 2005/0005261 A1 | 1/2005 | Severin |
| 2005/0012949 A1 | 1/2005 | Kitahara et al. |
| 2005/0050052 A1 | 3/2005 | Zimmerman et al. |
| 2005/0132356 A1 | 6/2005 | Cross et al. |
| 2005/0249400 A1 | 11/2005 | Fukumoto |
| 2006/0080274 A1 | 4/2006 | Mourad |
| 2006/0155561 A1 | 7/2006 | Harper |
| 2006/0217831 A1 | 9/2006 | Butterworth et al. |
| 2006/0284360 A1 | 12/2006 | Hume et al. |
| 2007/0041035 A1 | 2/2007 | Sembower et al. |
| 2007/0042885 A1 | 2/2007 | Rietjens et al. |
| 2007/0112460 A1 | 5/2007 | Kiselik |
| 2008/0020916 A1 | 1/2008 | Magnell |
| 2008/0048308 A1 | 2/2008 | Lam |
| 2008/0255945 A1 | 10/2008 | Percival et al. |
| 2008/0273945 A1 | 11/2008 | Levine et al. |
| 2009/0063381 A1 | 3/2009 | Chan et al. |
| 2009/0070213 A1 | 3/2009 | Miller et al. |
| 2009/0236752 A1 | 9/2009 | Lee et al. |
| 2009/0278843 A1 | 11/2009 | Evans |
| 2009/0282782 A1 | 11/2009 | Walker et al. |
| 2009/0287632 A1 | 11/2009 | Gombert et al. |
| 2010/0060909 A1 | 3/2010 | Conescu et al. |
| 2010/0098319 A1 | 4/2010 | Gombert et al. |
| 2010/0110479 A1 | 5/2010 | Gombert et al. |
| 2010/0214622 A1 | 8/2010 | Ruegg et al. |
| 2013/0120767 A1 | 5/2013 | Mandel et al. |
| 2013/0120770 A1 | 5/2013 | Mandel et al. |
| 2014/0038801 A1 | 2/2014 | Morgana et al. |
| 2014/0038802 A1 | 2/2014 | Clark et al. |
| 2014/0040319 A1 | 2/2014 | Morgana et al. |
| 2014/0121800 A1 | 5/2014 | Morgana et al. |

FOREIGN PATENT DOCUMENTS

| | | |
|---|---|---|
| WO | 2005054983 A2 | 6/2005 |
| WO | 2005122079 A2 | 12/2005 |
| WO | 2006108269 A1 | 10/2006 |
| WO | 20070219210 A2 | 2/2007 |

OTHER PUBLICATIONS http/www.esko.com/tmp/080606115325/G2558322_Kongsberg_tables_us_pdf Sep. 1, 2009.
Chen et al., "A Knowledge base System for Carton Package Design", GA2008, 11th Generative Art Conference, pp. 130-144.

CREATION OF VARIABLE CUT FILES FOR PACKAGE DESIGN

RELATED APPLICATIONS AND CLAIM OF PRIORITY

This patent application claims priority to, and is a continuation of, U.S. patent application Ser. No. 14/280,847, filed May 19, 2014, titled "Creation of Variable Cut Files for Package Design", the disclosure of which is fully incorporated into this document by reference.

In addition, this patent application is related to U.S. Pat. Nos. 8,994,734 and 9,158,875, each entitled "Package Definition System," the disclosures of which are fully incorporated herein by reference. This patent application is also related to U.S. Pat. No. 9,314,986, entitled "Method and System for Applying an Adaptive Perforation Cut to a Substrate," the disclosure of which is fully incorporated herein by reference.

BACKGROUND

There has been significant interest in the manufacture of personalized packaging for small volume applications. Methods and systems for creating personalized packaging are described in previous patent filings such as U.S. Pat. No. 8,994,734, titled "Package Definition System," and U.S. Pat. No. 8,869,083, titled "Dynamic Bridge Generation in Package Definition Systems." These systems allow an end user to create a package or similar three-dimensional structure by defining dimensions and providing some information about functionality. The system may create a small run of packages, or even a single package, after generating a cut file (which may also be referred to as a package design file) that includes rules and/or parameters that define the cuts and creases that the package generation equipment should impart to a substrate.

In real world applications there can be differences between the cut file details needed for various applications. This document describes methods and systems for improving automated package customization systems to address some or all of the issues described above.

SUMMARY

In an embodiment, a system includes a processor and a computer-readable memory containing programming instructions that, when executed, cause the processor to create a package design file. The file includes comprises a two-dimensional representation of a three-dimensional structure having a plurality of facets. The system creates the file by creating a set of cut and/or fold line definitions. Each cut/fold line definition includes parameters pursuant to which a cutting device will impart a cut line along which the three-dimensional structure will be separated from a two dimensional substrate or along which facets of the structure will be separated, and/or pursuant to which a folding device will impart a fold line along which a facet of the structure will be folded. The system identifies at least one of the cut and/or fold line definitions as a variable cut/fold line definition. For each identified variable cut/fold line definition, the system identifies one or more alternate parameters for the variable cut/fold line definition, a first cutting/folding scenario that will not use the alternate parameters, and a second cutting/folding scenario that will use the alternate parameters. The system may save the cut/fold line definitions, the parameters of the definition, the one or more alternate parameters for each definition, the first cutting/folding scenario, and the second cutting/folding scenario for each definition to a package design file. The system may also cause a cutting and/or folding device to create a package flat based on the package design file and the selected cutting/folding scenarios.

When creating the file or causing the device to create the package flat, the system may detect a condition of a cutting/folding device. Based on the detected condition, for each identified cut/fold line definition, the system may select either the first cutting/folding scenario or the second cutting/folding scenario that is associated with the definition.

Optionally, the first cutting/folding scenario may comprise a production run and the second cutting/folding scenario may comprise a proof run. If so, the alternate parameters may comprise parameters pursuant to which the device will impart cut lines for interlocking tabs and slots of the three-dimensional structure. The alternate parameters also may comprise parameters pursuant to which the device will expand or decrease a size of a flap, or change the number of flaps, that would contain the slots if created pursuant to the second cutting/folding scenario.

Optionally, the first cutting/folding scenario may comprise use of a substrate of a first thickness, and the second cutting/folding scenario may comprise use of a substrate of a second thickness, wherein the second thickness is different than (i.e. greater than or less than) the first thickness. If so, the alternate parameters may comprise parameters pursuant to which the device will impart cut lines that expand or decrease sizes of one or more interlocking tabs and slots of the three-dimensional structure.

Optionally, the first cutting/folding scenario may comprise use of a substrate of a first thickness, and the second cutting/folding scenario comprises use of a substrate of a second thickness, wherein the second thickness is different than the first thickness. If so, the alternate parameters may comprise parameters pursuant to which the device will impart cut lines that extend or reduce a length of one or more flaps of the three-dimensional structure.

Optionally, the first cutting/folding scenario comprises use of a substrate of a first thickness, and the second cutting/folding scenario may comprise use of a substrate of a second thickness, wherein the second thickness is greater than the first thickness. If so, the alternate parameters may comprise parameters pursuant to which the device will impart a fold line as two creases with a gap area between the two creases.

BRIEF DESCRIPTION OF THE DRAWINGS

FIG. 5A illustrates an example of a package flat proof, while

DETAILED DESCRIPTION

Figure 1:
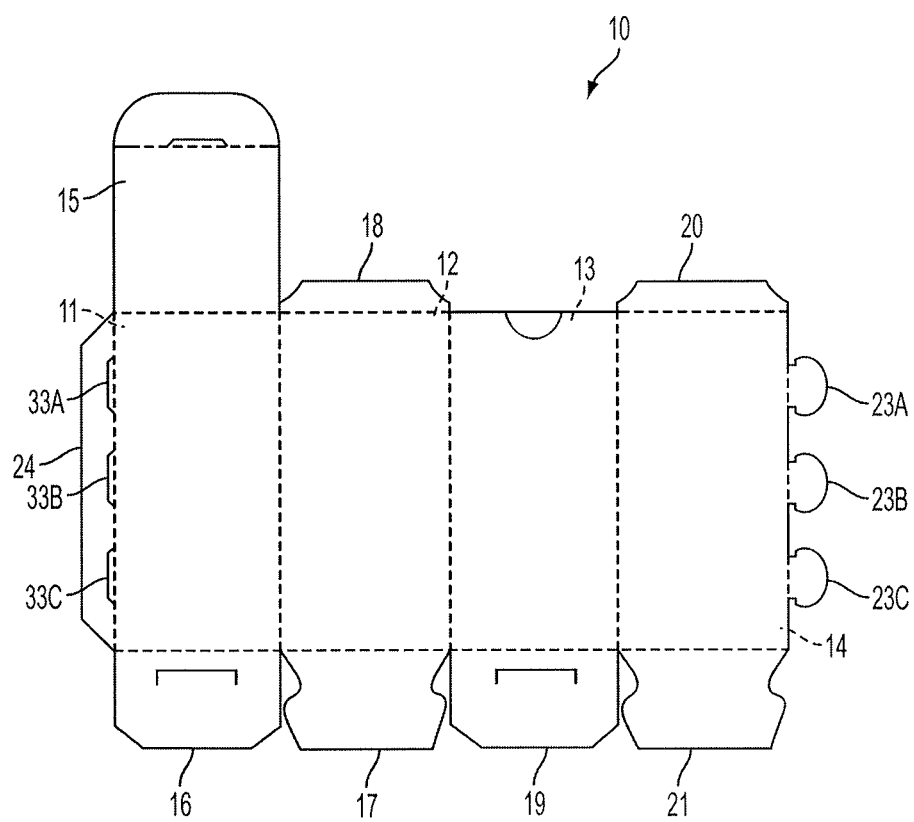
FIG. 1 depicts an example of a package flat.

This disclosure is not limited to the particular systems, devices and methods described, as these may vary. The terminology used in the description is for the purpose of describing the particular versions or embodiments only, and is not intended to limit the scope.

As used in this document, the singular forms of any word, and defining adjectives such as "a," "an" and "the," each include plural references unless the context clearly dictates otherwise. Unless defined otherwise, all technical and scientific terms used herein have the same meanings as commonly understood by one of ordinary skill in the art. As used in this document, the term "comprising" means "including, but not limited to."

A "package generation system" is a machine or group of machines that combines the features of a print device with one or more tools for imparting a cut, crease, and/or perforation on a printed substrate so that the substrate may be folded into a three-dimensional package, or other folds or structures, such as greeting cards.

A "package flat" refers to a generally two-dimensional structure having two or more facets formed in a substrate by cut lines (including perforations) and/or fold lines (including creases and/or score lines). As used in this document, the term "cut/fold" will be used generally to refer to both cut and fold lines. Similarly, the term "cut/fold file" may be used to refer to a file containing instructions for cut lines, fold lines or both; a "cutting/folding device" encompasses a device that is a device that can impart cuts, a device that can impart fold lines, or a device that can perform both functions; and a "cut/fold scenario" may refer to a scenario involving cutting, folding or both. The package flat also may include printed content on one or more of the facets. The flat may be removed from the substrate at the cut lines, and the flat may then be folded into a three-dimensional structure having two or more sides. The actual three-dimensional shape of the package is subsequently created by folding and commonly connecting the facets that make up the flat. This imposes a variety of restrictions on the structure both in its two dimensional form, as well as in its three dimensional form. The substrate is typically (but not necessarily) a paper material, such as cardstock, cardboard, or paper having sufficient thickness to provide structural support when folded into a three-dimensional shape.

Package production may be performed by a package generation system that is capable of performing printing operations on, and applying creases and cuts to, a substrate. The system also may perform other actions such as coating and/or stacking the substrate. Examples of automated package generation systems include those in the iGen® series of digital production printing presses, available from Xerox Corporation, in connection with corresponding finishing devices. Other systems may include smaller printing devices, such as a Xerox DocuColor® 250, or a digital cutter as offered by a variety of manufacturers.

FIG. 1 shows a common package flat 10, in this case a rectangular box, with a variety of facets 11-23 as they may be commonly envisioned by a human. Some of the facets may serve as external faces such as sidewalls or lids of the finished package (see, for example, facet 11). Other facets may serve as functional elements in that they function as a supporting structure by interlocking with other functional elements (see, for example, facet 23, represented by elements 23A-B-C, and facet 24 which includes elements 33A-B-C). Some facets may be both faces and functional elements (see, for example, facet 16).

To define the package, a system may generate a user interface that allows a user to enter dimensional and functional information. The system may then use that information to create a package definition file containing instructions for cut lines and fold lines that package generation equipment may use to construct the package flat. In FIG. 1, the cut lines are represented by solid lines, and the fold lines are illustrated by dashed lines. Different equipment, or different settings on a single piece of equipment, may be used to impart a cut line than would be used to impart a fold line. For example, a cut line may be imparted using a knife with sufficient force to cut through the substrate. A fold line may be imparted with a roller to apply a crease, by a knife that uses a reduced cutting force that does not cut all the way through the substrate, or by another means.

In the example of FIG. 1, the user may have entered (or the system may have otherwise received) dimensional information such as height, width and depth. The user or other source also may have provided functional requirements such as a lid and locking floor. Or, the user may have identified (or the system may have received) a package intent, and the system may have used the intent to determine appropriate dimensions and shapes. The system may use this information to define the facets, and functional elements. Note that in the example of FIG. 1, the location of the lid facet may vary, as the lid facet 15 could be attached to any side facet, so long as its corresponding functional element facet 16 were attached to the same side, without altering the resulting three-dimensional structure.

Figure 2A:
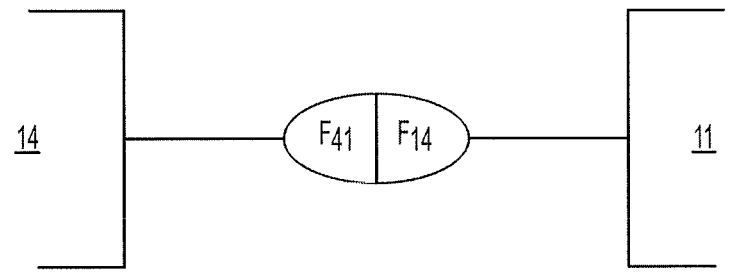
FIG. 2A is a graph representation of a portion of a package flat with interconnecting functional elements, while FIG. 2B explodes the representation of FIG. 2A to show physical cut elements and corresponding connections.
Figure 2B:
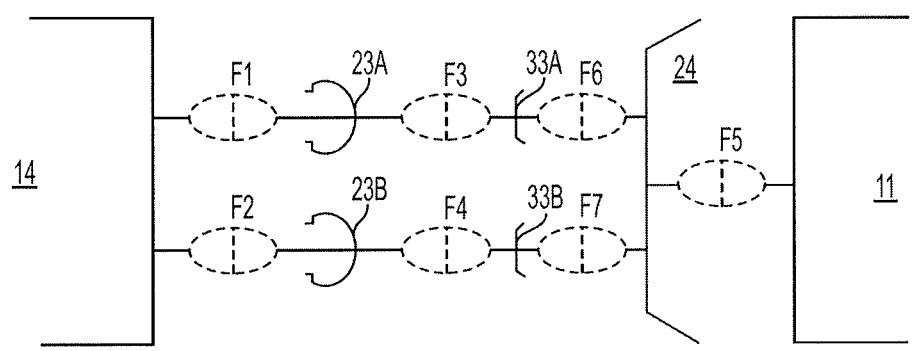

As noted above, functional elements are facets (or portions of facets) that have a functional property for the three dimensional structure, and may or may not be visible in the closed package. Examples of such functional properties include rigidity and dust protection. This document will use the term "tab" when referring to a functional element that connects with another element in a secure manner, such as with a tab-and slot arrangement. It will use "flap" when referring to a functional element that covers a seam in a manner that allows it to easily be opened, and thus it may not substantially contribute to stability. Functional elements are typically not fully defined by user input of dimensions such as height, width or depth, but rather are dynamically generated based on other dimensions, features and/or intended uses of the package. FIG. 2A is a graph representation of functional elements that may interconnect faces 11 and 14 of FIG. 1. The two faces are functionally connected via elements $F_{14}$, and $F_{41}$. FIG. 2B explodes the view of FIG. 2A to show the cut/fold data that may be used to create the functional elements 23A, 23B, 33A and 33B.

Functional elements in this discussion may refer to a single element or a group of functional elements, in which the notation $F_{X,Y}$ indicates a complete functional element and a direct label. When stored in a data file, a node may contain dimension information, tag information that pertains to the function of the facet, and printable information such as associated text and/or image and print orientation. Links describe the interconnected relationship between related functional element pairs. A link may contain general description information, such as a "fold." In addition or alternatively, the link may include more specific information about how a package generation device should create an edge to allow the connecting relationship, such as by applying a crease, a "kiss cut" or any other method. A link may include structural information in the form of a functional element link that will later be resolved into additional nodes and links until all remaining links are of a simple fold or dimension form.

With a graph representation that incorporates nodes and functional element links such as is shown in FIGS. 2A and 2B (which this document may refer to as a functional element representation), a processor may create a rule set that includes instructions for applying cut and fold lines to define the functional elements and other elements of the package. The rule set may include instructions to alter the number and size/shape of functional elements or their components, to bind functional elements that are disjointed in a two-dimensional flat but joined in a three-dimensional space, and to create an outline cut. An example of an outline cut is shown by the outermost (solid) lines in the package flat 10 of FIG. 1.

To produce the outline cut of a package, a processor may first resolve all functional element links that map into nodes in the given the final package structure and dimensions, "walk" the graph representation by starting on any facet and selecting an edge that does not have a fold-connecting relationship to another facet. The system produces a cut command for that edge, and then follows adjacent edges in a clockwise direction, counter-clockwise direction, or another determined order for a sequence of adjacent non-fold edges, producing cut commands for them and continuing until it reaches an edge that has fold-connecting relationship with another facet. When that happens, the system steps in to that facet and looks to the counter-clockwise adjacent edge, and proceeds as it did for the previous facet, producing cut commands for sequences of non-fold edges and stepping through to the connected facet for fold edges. This continues until it returns to the starting point. In that manner the system defines the cut commands for the outline of the box in a counter-clockwise order while stepping in an organized way through the graph. It should be noted that the invention is not limited to operation in a counter-clockwise direction, as it may move in a clockwise direction as well.

To generate fold line instructions and other cut line instructions, the system may analyze each facet. In addition or alternatively, it may analyze each edge that is not part of the outline cut. Facets that have fold-connecting edges may receive fold line commands with kiss cuts, fold knife or other fold options selected. Edges that are not fold-connecting may receive cut line commands. Other methods of generating cut line and fold line instructions may be used.

The system may save the instructions and/or parameters for creating the cut and fold lines to a data file that a package generation system will use to create the package flat. In some situations, this data may need to dynamically change between proof and production runs based on differences in equipment used, desired package properties, different substrate properties, or other considerations.

Figures 3A, 3B, 3C:
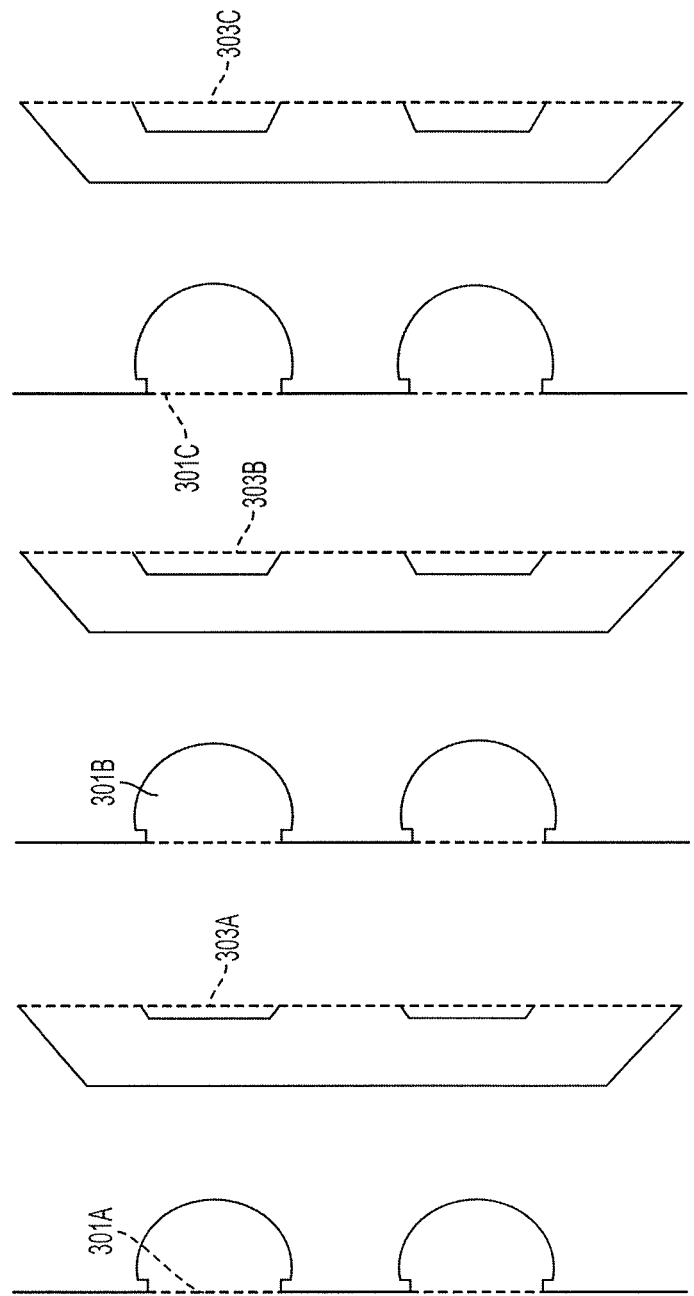
FIGS. 3A-3C illustrate examples of how the structure of interlocking tab/slot pairs may vary based on thickness of the substrate used.

As an example, FIGS. 3A-3C show that in some scenarios, it may be desirable for the dimensions of an interlocking tab-and-slot pair to change based on thickness of the substrate. For example, FIG. 3A shows an example where the tab 301A has a small neck to fit into a small slot 303A, which may be appropriate for a thin substrate but not necessarily for a thick substrate. FIG. 3B shows that a moderately thicker substrate may need a longer-necked tab 301B and a deeper slot 303B, while an even thicker substrate may require the extended tab 301C and even deeper slot 303C of FIG. 3C.

Figure 4A:
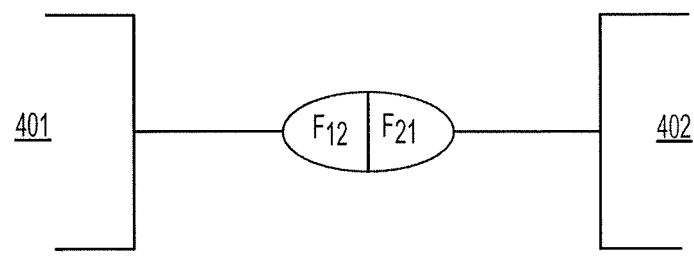
FIGS. 4A-4C illustrate an example of how fold line design may vary based on the thickness of the substrate that is used.
Figure 4B:
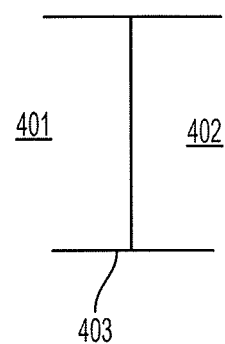
Figure 4C:
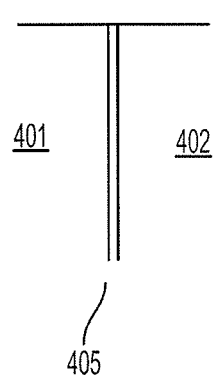

Another functional element that may depend on thickness of the substrate used is any functional element that is used to close the package, such as lids or other folding elements that are to fit within a receiving element. For example, a lid that will cover a dustflap can be extended a sufficient amount to allow the lid to rest on top while still closing in the front. If the lid is extended too much, it will leave a gap when it folds. If the lid is extended too little, it may not reach the point of closure. To remedy this, the system's folding device may impart a fold line as two creases with a base area between the two creases. This is illustrated in FIGS. 4A-4C, in which FIG. 4A illustrates two facets 401, 402 that will be joined by a crease represented as functional element pair $F_{1,2}$ $F_{2,1}$ FIG. 4B illustrates the functional element pair (fold line) as crease 403. The embodiment of FIG. 4C includes a thicker substrate than that of FIG. 4B, so that the fold line 405 is imparted as two parallel creases with a gap area in between the two creases.

Another functional element that might depend on thickness of substrate used is any functional element that is realized as a fold. For example, a thick substrate might require multiple fold lines and thus an actual facet between fold-lines to maintain geometric accuracy.

Figure 5B:
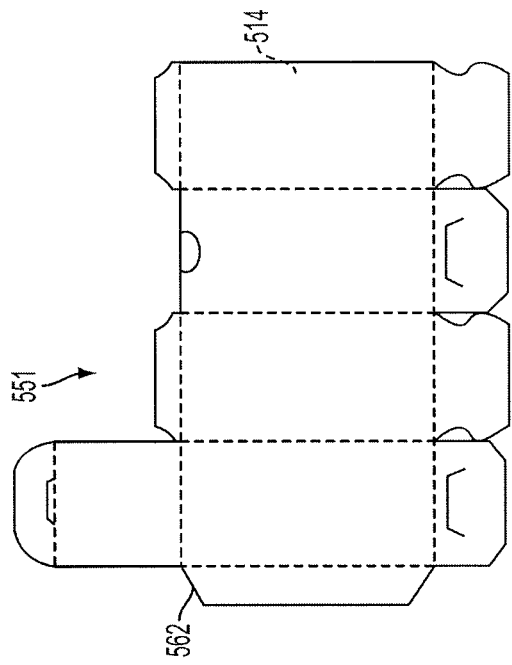
FIG. 5B illustrates an example of a production run package flat.
Figure 5A:
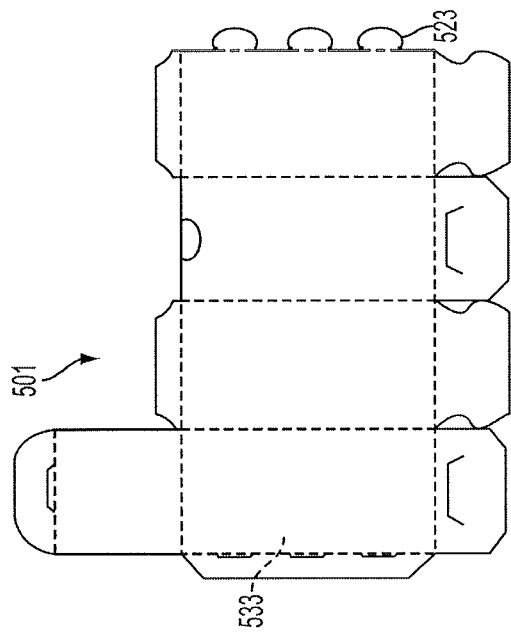

Another scenario where late binding adjustment may be useful is when a cut file moves from use in generating a sample (i.e., proof of concept) to a production run. This scenario is similar to moving from a draft mode of printing a document to a high quality print mode. In proof mode, the cut geometry may be simpler, as the samples generated in proof mode are typically for testing or display. In the proof situation, speed and ease of assembly may be more important than durability of the package. For example, a draft mode may use interlocking tabs and slots for some functional elements so that the package can be easily assembled without the need for an adhesive. In contrast, the production mode of the same package may eliminate some interlocking tabs and replace them with straight line flaps that will be glued together after final production. An example of this is shown in FIGS. 5A and 5B, where the proof package flat 501 includes interlocking slots 533 and tabs 523, while the production run package flat 551 eliminates those tabs and instead relies on a flap 562 that will be connected to the inside of facet 554 with an adhesive for a more rigid structure.

Figure 6:
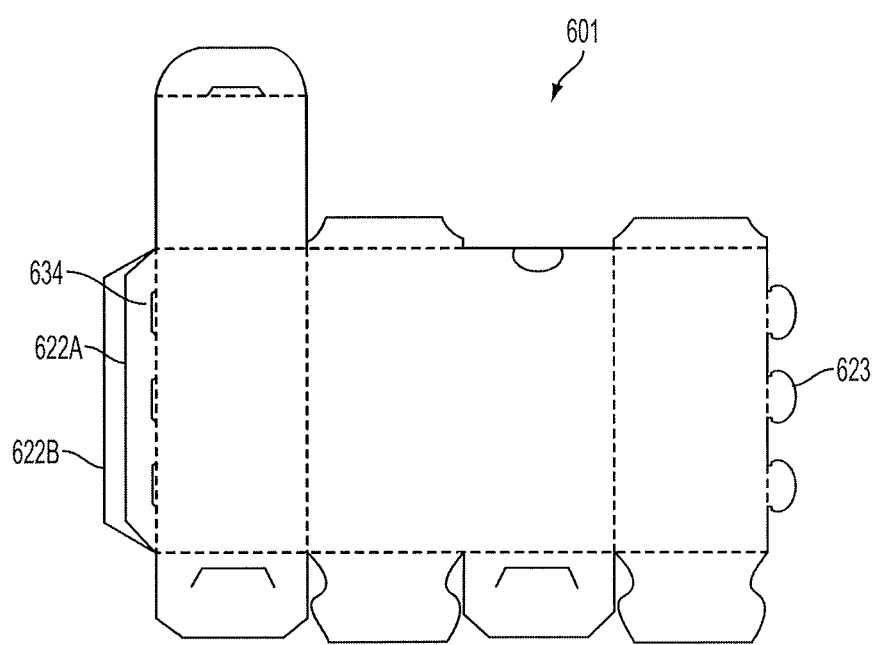
FIG. 6 illustrates an example of what a package flat may look like in multiple cut/fold scenarios.

To account for situations such as those shown in FIGS. 3A-3C, 4A-4C and 5A-5B, the method and system of this document may create a variable cut file that defines one or more cut lines as conditional paths that are dependent on parameters such as thickness of substrate or whether the run is a proof run or a production run. Here it is understood that the terms cut line and cut file are encompassing cuts, folds and other elements. FIG. 6. is a conceptual representation of a package 601 having definitions that may include such conditional paths. In this example, a proof run of the cut file may include cut lines for tabs 623 and slots 634, and the side flap may follow the cut path shown as 622A. However, in the production run a system may omit cut lines for tabs 623 and slots 634, and the side flap may follow the cut path shown as 622B.

Figure 7:
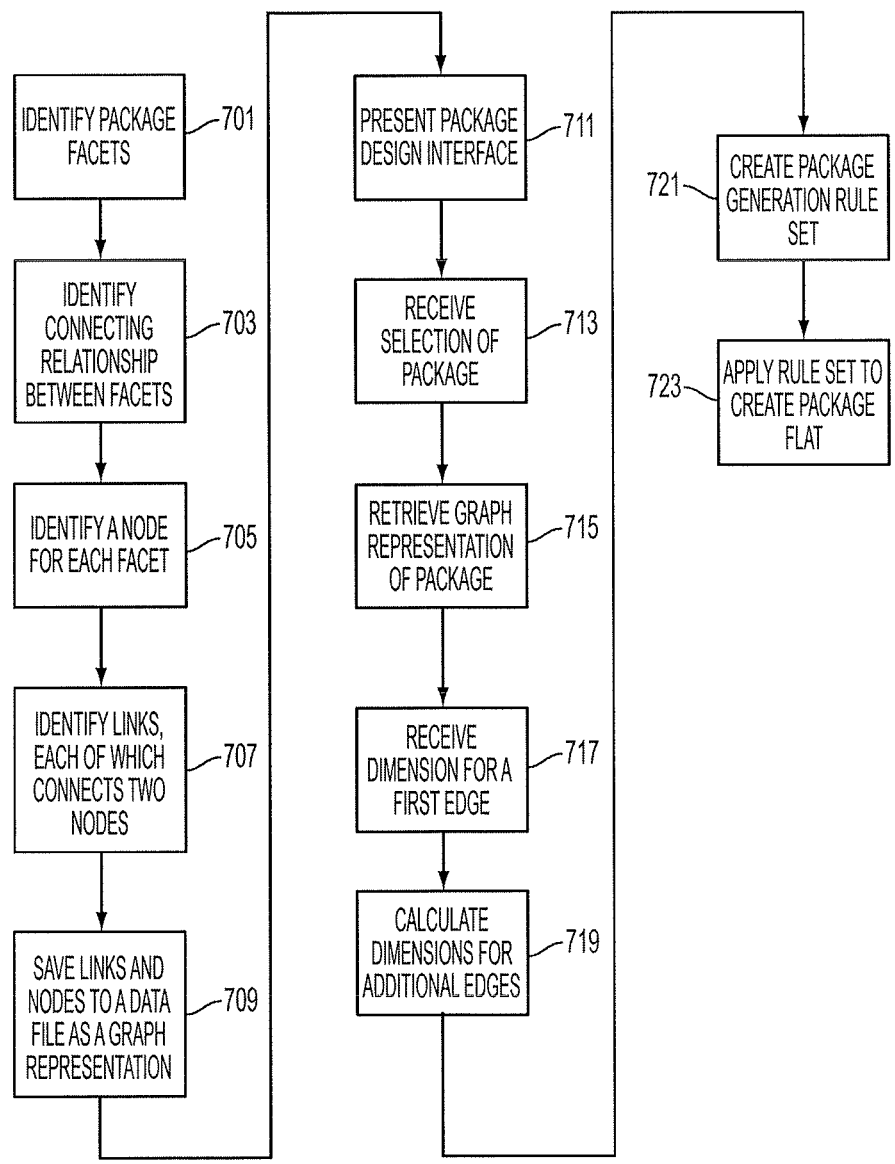
FIG. 7 is a flowchart illustrating a method of creating a package design file and using the file to create a package flat.

FIG. 7 illustrates steps that a package definition system may follow when creating a graph representation of a three-dimensional package. The system may identify a set of facets for the package 701. Initially, each facet will be a face which will include a set of edges. For each edge, the system may identify a connecting relationship between the edge's facet and a different one of the faces 703. The system will then create a graph representation of the three dimensional package made up of links and nodes and introduce the functional element nodes that may or may not be mapped to facets, dependent on the functional layout of the package. In the initial stage, the dynamic graph will thus contain the nodes representing the facets of the package that are described as faces, plus a set of functional elements which might in a later stage be mapped to additional nodes connected by additional functional element links. The system will assign each node to a facet so that it represents the facet 705. The system will assign a link to each pair of nodes that have a connecting relationship between two of their edges 707. The system may then save the graph representation to a memory as a data file 709.

When a user seeks to design a package, the system may present a package design user interface to the user 711. The user may use the user interface to select a package 713 such as by specifying its template or generic structure. The system will populate the graph representation with the nodes and links relevant to the desired structure and optionally display to the user a resolved graph with default sizes for the face elements of the desired structure that corresponds to the structure 715. The user will specify one or more dimensions 717, which may be newly-developed or predefined. The system will use the graph representation to determine dimensions for the other connected elements 719, be they direct, fold-linked, edges between shape elements or functional elements or be they "dimension relationship-linked" edges. Links that are dimension links are edges that, though not adjacent in the two dimensional flat, are adjacent, or otherwise related in a dimensional way in the three-dimensional folded version of the package. For example, to start the dimension development process the system may identify a linked edge that has a connecting relationship with the user-specified edge, and determining a dimension for the linked edge based on the user-selected dimension for the user-specified edge. From that linked edge, the user dimension may be propagated further to other edges in the graph via links in the graph and by geometric symmetry within facets. By seeding user-specified dimensions into the graph and then propagating the dimensions across links, the actual dimensions of all facet edges can be obtained.

In another step, the system will determine the specific structure of the functional elements based on the desired structure and based on the subsequently input size information from the links. This is done by visiting all links and resolving all links that are not simple "fold" or "dimension" links into their appropriate number of nodes and links based on the structural information and dimensional information. The system will then create a package generation rule set that includes the dimensions and structural parameters for each of the facets 721.

The rule set may include, for example, a set of cutting and/or scoring instructions that a package generating device may use to apply cut lines and/or fold lines to a substrate. The instructions may be saved to a computer readable memory such as a package generation file. The system may do this by retrieving a group of instructions for the edges of each facet from an instruction database, modifying groups as necessary based on each facet's relative position in the package, and then combining each retrieved group into an overall instruction set for the package flat. The instructions may include a series of instructions to either (a) apply a cut or fold line to the substrate, or (b) move the tool to a new position on the substrate without altering the substrate. The system may then use a package generation device to apply the package generation rule set by imparting cut lines and fold lines to a substrate to yield a package flat 723.

Figure 8:
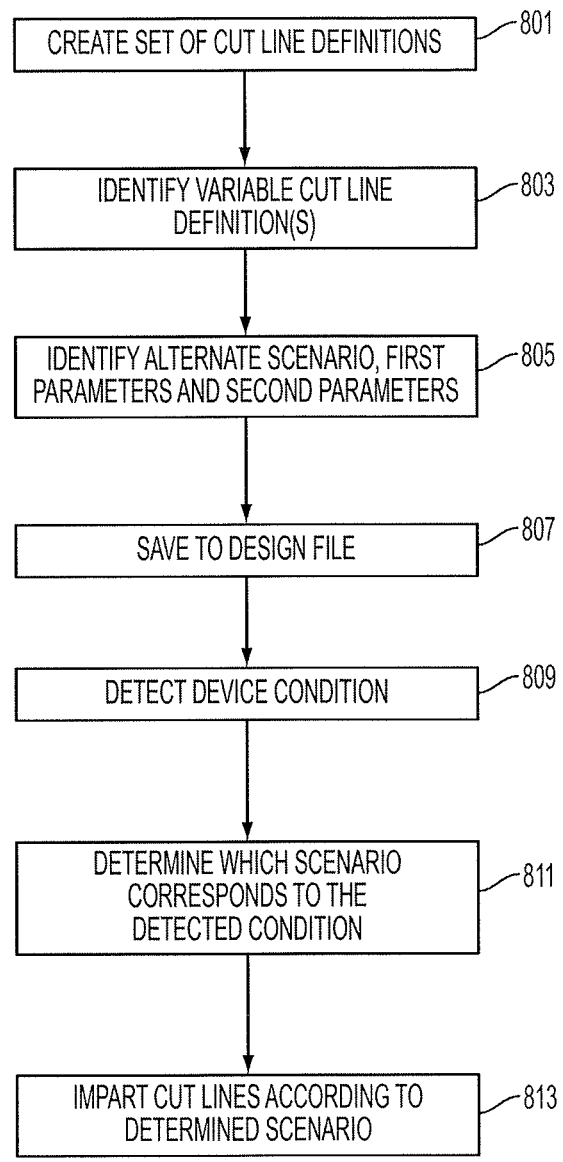
FIG. 8 is a flowchart illustrating a method of including multiple cut/fold scenarios in a single package design file.

When creating the rule set, the system may identify one or more alternate cutting scenarios for a particular package design. FIG. 8 illustrates a process by which this may occur when creating a package design file. As noted above, the package design file may include a two-dimensional representation of a three-dimensional structure having various facets. The system may create a set of cut line definitions 801, where each cut line definition includes a set of parameters pursuant to which a cutting device will impart a line along which the three-dimensional structure will be separated from a two dimensional substrate. The parameters may include, for example, line dimensions (length, width, etc.), points of intersection, force parameters (which may differ for cut lines vs. fold lines) and other parameters.

The system may identify at least one of the cut line definitions as a variable cut line definition 803. A variable cut line definition is one that includes one or more parameters that will vary based on the real-time cutting scenario, such as proof vs. production, thickness of substrate, or other scenarios. For each identified variable cut line definition, the system will identify one or more alternate parameters for the variable cut line definition, along with a first cutting scenario that will not use the alternate parameters, and a second cutting scenario that will use the alternate parameters 805. For example, referring back to FIG. 6, the file may include a definition that includes parameters for flap boundary 623B for a production run scenario, but that replaces those parameters with the parameters for a narrower flap 622A and interlocking tab-and-slot elements 634 and 635 in a proof run scenario. As another example, referring to FIGS. 3A-3C, the system may select parameters for one of these three options depending on the thickness of the substrate used (with each thickness being an alternate scenario, and a thicker substrate corresponding to an increased size of the tabs and slots, and a thinner substrate corresponding to a decreased size of the tabs and slots). Extended lids also may be used for scenarios involving thicker substrates.

Returning to FIG. 8, the system may save the cut line definitions, the first scenario parameters, the (second scenario) parameters, the first cutting scenario, and the second cutting scenario to a package design file 807. The system is not limited to two scenarios and two sets of parameters; any number of scenarios and corresponding alternate parameters may apply.

Optionally, when applying such a cut file to create a package from a substrate, a package generation system may detect a condition of the cutting device 809. The condition may include a user-specified identification of the applicable scenario (e.g., proof run vs. production run). Alternatively, conditions such as substrate size may be automatically detected by the cutting equipment sensors. One or more conditions may be considered to be default conditions, such that the system will always determine that a default condition exists unless an alternate condition is detected. For example, a default condition may be production run, while an alternate condition may be proof run, or vice versa.

Based on the detected condition, the system may determine which scenario is present 811. The system's cutting device will use the package design file to impart cut lines using the parameters that correspond to the determined scenario 813. For example, it may use a first group of parameters only if a first scenario is present, alternate parameters only if a second scenario is present, etc.

Figure 9:
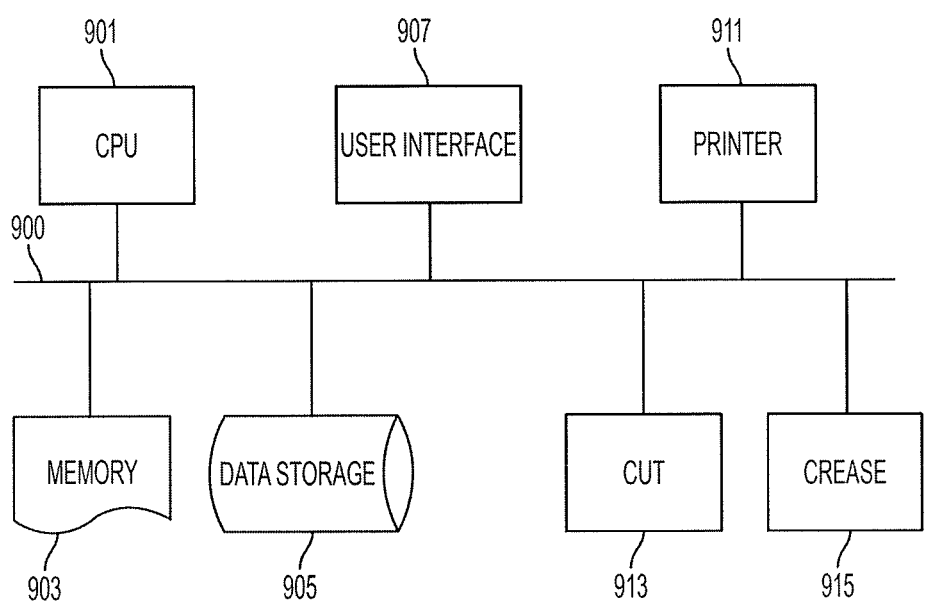
FIG. 9 is a block diagram showing various equipment that may be used to implement various embodiments of the processes described in this document.

FIG. 9 depicts a block diagram of hardware and/or electronics that may make up a package definition and/or production system. One or more communications lines 900 such as a bus or network interconnect the illustrated components and allow data and/or signals to flow between the components. CPU 905 represents one or more processors that perform calculations and logic operations required to execute a program. Any number of processors may be available, and they may be part of a single electronic device or distributed across any number of networked electronic devices. When this document and any claim uses the term "processor," then unless specifically stated otherwise it is intended to refer to all such embodiments (i.e., single processor or multiple processors). The processor(s) may access a computer-readable memory device 903 containing programming instructions, along with a data storage facility 905 such as a database that stores the package generation templates and/or rule sets.

A user interface 907 is a device or system that provides output to, and receives input from, a user. The user interface may include a display, audio output, a printer, or another element that provides information to a user. The user interface 907 also may include a touch-sensitive component, microphone, audio port, keyboard, mouse, touch pad, or other input mechanism that is capable of receiving user input.

The system also may include a package generation device, which may include some or all of the following elements: a printer 911, a knife or other cutting device 913, and a roller or other device 915 capable of imparting a crease in a substrate.

The features and functions disclosed above, as well as alternatives, may be combined into many other different systems or applications. Various presently unforeseen or unanticipated alternatives, modifications, variations or improvements may be made by those skilled in the art, each of which is also intended to be encompassed by the disclosed embodiments.

The invention claimed is:

1. A package generation system, comprising:
   a cutting/folding device;
   a processor; and
   a non-transitory computer-readable medium containing programming instructions that, when executed, cause the processor to cause the cutting/folding device to create a package having a plurality of facets by:
   accessing a package design file comprising a set of cut/fold line definitions, wherein:
      each cut/fold line definition in the set comprises parameters pursuant to which the cutting/folding device will impart a cut line or a fold line to a substrate; and
      at least one of the cut/fold line definitions is a variable cut/fold line definition that includes a first set of values for the parameters and one or more alternate sets of values for the parameters; wherein:
         the first set of values corresponds to a first cutting/folding scenario, and
         the one or more alternate sets of values corresponds to one or more alternate cutting/folding scenarios,
   detecting a condition of the cutting/folding device,
   based on the condition, determining whether the first cutting/folding scenario or an alternate cutting/folding scenario is present, and
   if the first cutting/folding scenario is present, causing the cutting/folding device to impart cut/fold lines on the substrate according to the first set of values, otherwise causing the cutting/folding device to impart cut/fold lines on the substrate according to one of the alternate sets of values.

2. The system of claim 1, wherein:
   the first cutting/folding scenario comprises a production run;
   the one or more alternate cutting/folding scenarios comprises a proof run;
   the cutting/folding device comprises a cutting device; and
   the one or more alternate sets of values for the parameters for the proof run comprises parameters pursuant to which the cutting device will impart, onto the substrate, cut lines for interlocking tabs and slots of the package; and
   the first set of values for the parameters for the production run does not comprise parameters pursuant to which the cutting device will impart cut lines for the interlocking tabs and slots.

3. The system of claim 1, wherein the one or more alternate sets of values for the parameters comprise an alternate number of flaps or an alternative flap size as compared to the first set of values for the parameters.

4. The system of claim 1, wherein:
   the cutting/folding device comprises a cutting device; and
   the one or more alternate sets of values for the parameters comprise values pursuant to which the cutting device will impart, onto the substrate, cut lines that alter sizes of one or more interlocking tabs and slots of the package.

5. The system of claim 1, wherein:
   the cutting/folding device comprises a cutting device; and
   the one or more alternate sets of values for the parameters comprise values pursuant to which the cutting device will impart, onto the substrate, cut lines that alter a length of one or more flaps of the package.

6. The system of claim 1, wherein:
   the cutting/folding device comprises a folding device; and
   the one or more alternate sets of values for the parameters comprise values pursuant to which the folding device will impart a fold line as two creases with a gap area between the two creases.

7. The system of claim 1, wherein:
   the instructions to detect a condition of the cutting/folding device comprise instructions to determine a thickness of the substrate; and
   the instructions to determine whether the first cutting/folding scenario or an alternate cutting/folding scenario is present comprise instructions to do so based on at least the determined thickness of the substrate.

8. The system of claim 7, wherein the instructions to determine whether the first cutting/folding scenario or an alternate cutting/folding scenario is present comprise instructions to:
   determine that the first cutting/folding scenario is present if the substrate has a first thickness; and
   determine that an alternate cutting/folding scenario is present if the substrate has a thickness other than the first thickness.

9. The system of claim 1, wherein:
   the instructions to detect a condition of the cutting/folding device comprise instructions to determine whether the device is set to a production run or a proof run; and the instructions to determine whether the first cutting/folding scenario or an alternate cutting/folding scenario is present comprise instructions to determine that:
the first cutting/folding scenario is present if the condition is a production run, or
an alternate cutting/folding scenario is present if the condition is a proof run.

10. A method of generating a package, comprising, by a processor, executing programming instructions that cause the processor to:
access a package design file comprising a set of cut/fold line definitions, wherein:
each cut/fold line definition in the set comprises parameters pursuant to which a cutting/folding device will impart a cut line or a fold line to a substrate; and
at least one of the cut/fold line definitions is a variable cut/fold line definition that includes a first set of values for the parameters and one or more alternate sets of values for the parameters; wherein:
the first set of values corresponds to a first cutting/folding scenario, and
the one or more alternate sets of values corresponds to one or more alternate cutting/folding scenarios,
detect a condition of a cutting/folding device,
based on the condition, determine whether the first cutting/folding scenario or an alternate cutting/folding scenario is present, and
if the first cutting/folding scenario is present, cause the cutting/folding device to impart cut/fold lines on the substrate according to the first set of values, otherwise cause the cutting/folding device to impart cut/fold lines on the substrate according to one of the alternate sets of values.

11. The method of claim 10, wherein:
the first cutting/folding scenario comprises a production run;
the one or more alternate cutting/folding scenarios comprise a proof run;
the cutting/folding device comprises a cutting device; and
the one or more alternate sets of values for the parameters for the proof run comprises parameters pursuant to which the cutting device will impart, onto the substrate, cut lines for interlocking tabs and slots of the package; and
the first set of values for the parameters for the production run does not comprise parameters pursuant to which the cutting device will impart cut lines for the interlocking tabs and slots.

12. The method of claim 10, wherein the one or more alternate sets of values for the parameters comprise an alternate number of flaps or an alternative flap size as compared to the first set of values for the parameters.

13. The method of claim 10, wherein the one or more alternate sets of values for the parameters comprise values pursuant to which the cutting/folding device will impart, onto the substrate, cut lines that alter sizes of one or more interlocking tabs and slots of the package.

14. The method of claim 10, wherein the one or more alternate sets of values for the parameters comprise values pursuant to which the cutting/folding device will impart, onto the substrate, cut lines that alter a length of one or more flaps of the package.

15. The method of claim 10, wherein the one or more alternate sets of values for the parameters comprise values pursuant to which the cutting/folding device will impart a fold line as two creases with a gap area between the two creases.

16. The method of claim 10, wherein:
when detecting a condition of the device, the processor determines a thickness of the substrate; and
when determining whether the first cutting/folding scenario or an alternate cutting/folding scenario is present, the processor does so based on at least the determined thickness of the substrate.

17. The method of claim 10, wherein when determining whether the first cutting/folding scenario or an alternate cutting/folding scenario is present, the processor determines that:
the first cutting/folding scenario is present if the substrate has a first thickness; or
an alternate cutting/folding scenario is present if the substrate has a thickness other than the first thickness.

18. The method of claim 10, wherein:
when detecting a condition of the cutting/folding device, the processor determines whether the cutting/folding device is set to a production run or a proof run; and
the instructions to determine whether the first cutting/folding scenario or an alternate cutting/folding scenario is present comprise instructions to determine that:
the first cutting/folding scenario is present if the condition is a production run, or
an alternate cutting/folding scenario is present if the condition is a proof run.

19. A method of generating a package, comprising, by a processor, executing programming instructions that cause the processor to:
access a package design file comprising a set of cut/fold line definitions, wherein:
each cut/fold line definition in the set comprises parameters pursuant to which a cutting/folding device will impart a cut line or a fold line to a substrate; and
at least one of the cut/fold line definitions is a variable cut/fold line definition that includes a first set of values for the parameters and an alternate set of values for the parameters; wherein:
the first set of values corresponds to a first cutting/folding scenario, and
the alternate set of values corresponds to an alternate cutting/folding scenario pursuant to which the cutting/folding device will impart a fold line as two creases with a gap area between the two creases,
detect a condition of a cutting/folding device,
based on the condition, determine whether the first cutting/folding scenario or an alternate cutting/folding scenario is present, and
if the first cutting/folding scenario is present, cause the cutting/folding device to impart cut/fold lines on the substrate according to the first set of values, otherwise cause the cutting/folding device to impart cut/fold lines on the substrate according to the alternate sets of values.

20. The method of claim 19, wherein:
the alternate cutting/folding scenario also comprises one or more alternate parameter values that comprise an alternate number of flaps, an alternative flap size, an alternative interlocking tab and/or slot size, or an alternative flap length as compared to the first set of values for the parameters.

* * * * *